US010850507B2

(12) United States Patent
Mine et al.

(10) Patent No.: US 10,850,507 B2
(45) Date of Patent: Dec. 1, 2020

(54) SUBSTRATE COATING DEVICE HAVING MOVING UNIT FOR MOVING SUBSTRATE HOLDING UNIT AND DROPLET DISCHARGING UNIT IN MAIN SCANNING DIRECTION AND SUB SCANNING DIRECTION AND METHOD

(71) Applicant: Tokyo Electron Limited, Tokyo (JP)

(72) Inventors: Yousuke Mine, Kumamoto (JP); Kazuhito Miyazaki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 15/881,904

(22) Filed: Jan. 29, 2018

(65) Prior Publication Data
US 2018/0219188 A1 Aug. 2, 2018

(30) Foreign Application Priority Data
Feb. 1, 2017 (JP) ................. 2017-017053

(51) Int. Cl.
*B41J 2/045* (2006.01)
*B05C 11/10* (2006.01)
(Continued)

(52) U.S. Cl.
CPC ........... *B41J 2/0456* (2013.01); *B05C 11/101* (2013.01); *B05D 1/34* (2013.01); *B41J 2/1721* (2013.01); *B41J 3/28* (2013.01); *B41J 3/407* (2013.01); *H01L 22/20* (2013.01); *H01L 51/56* (2013.01); *B05B 15/50* (2018.02); *B41J 2002/1742* (2013.01); *G01G 11/08* (2013.01); *H01L 51/0005* (2013.01); *H01L 51/5012* (2013.01); *H01L 51/5056* (2013.01); *H01L 51/5092* (2013.01); *H05B 33/10* (2013.01)

(58) Field of Classification Search
CPC ...................................... B41J 2/0456
See application file for complete search history.

(56) References Cited

U.S. PATENT DOCUMENTS 5,147,610 A * 9/1992 Watanabe ............ G01N 35/025
422/64
9,884,475 B2 * 2/2018 Nally ................ B32B 17/10807
(Continued)

FOREIGN PATENT DOCUMENTS

JP 2004-177262 A 6/2004
WO WO-2016203299 A1 * 12/2016 ........... B28B 11/001

*Primary Examiner* — Karl Kurple
(74) *Attorney, Agent, or Firm* — Abelman, Frayne & Schwab

(57) ABSTRACT

Disclosed is a coating device which draws a pattern of a functional liquid on a substrate. The coating device includes: a substrate holding unit which holds the substrate; a droplet discharging unit which discharges a droplet of the functional liquid on the substrate held by the substrate holding unit; a moving unit which relatively moves the substrate holding unit and the droplet discharging unit in a main scanning direction and a sub scanning direction on a base; a mass measuring unit including a cup which receives the droplet discharged by the droplet discharging unit and a mass measuring device which measures a mass of the functional liquid accumulated in the cup; and a liquid drain unit which drains the functional liquid accumulated in the cup.

6 Claims, 10 Drawing Sheets

(51) Int. Cl.

| | |
|---|---|
| *B05D 1/34* | (2006.01) |
| *H01L 51/56* | (2006.01) |
| *H01L 21/66* | (2006.01) |
| *B41J 2/17* | (2006.01) |
| *B41J 3/28* | (2006.01) |
| *B41J 3/407* | (2006.01) |
| *B05B 15/50* | (2018.01) |
| *H01L 51/00* | (2006.01) |
| *H01L 51/50* | (2006.01) |
| *H05B 33/10* | (2006.01) |
| *G01G 11/08* | (2006.01) |

(56) References Cited

U.S. PATENT DOCUMENTS

| | | | |
|---|---|---|---|
| 2009/0008159 A1* | 1/2009 | Yamamoto | B41J 2/04506 177/180 |
| 2009/0239360 A1* | 9/2009 | Sato | H05K 3/125 438/502 |
| 2009/0258563 A1* | 10/2009 | Kwak | G01F 25/0092 445/3 |
| 2012/0234459 A1* | 9/2012 | Nally | B32B 17/10807 156/64 |
| 2012/0298036 A1* | 11/2012 | Ogawa | B41J 2/165 118/712 |
| 2013/0136858 A1* | 5/2013 | Dutt | B05C 11/08 427/207.1 |
| 2013/0155141 A1* | 6/2013 | Miedema | B41J 2/16538 347/19 |
| 2017/0062762 A1* | 3/2017 | Jain | C09D 135/02 |
| 2018/0111288 A1* | 4/2018 | Palumbo | B28B 11/001 |

\* cited by examiner

SUBSTRATE COATING DEVICE HAVING MOVING UNIT FOR MOVING SUBSTRATE HOLDING UNIT AND DROPLET DISCHARGING UNIT IN MAIN SCANNING DIRECTION AND SUB SCANNING DIRECTION AND METHOD

CROSS-REFERENCE TO RELATED APPLICATION

This application is based on and claims priority from Japanese Patent Application No. 2017-017053 filed on Feb. 1, 2017 with the Japan Patent Office, the disclosure of which is incorporated herein in its entirety by reference.

TECHNICAL FIELD

The present disclosure relates to a coating device and a coating method.

BACKGROUND

In the related art, organic light emitting diodes (OLEDs) which are light emitting diodes using organic electroluminescence (EL) light emission have been known. An organic EL display using organic light emitting diodes has advantages of being thin, lightweight, low in power consumption, and excellent in response speed, viewing angle, and contrast ratio. For this reason, the organic EL display has recently attracted attention as a next-generation flat panel display (FPD).

The organic light emitting diode has an anode formed on a substrate, a cathode provided on the opposite side of the substrate with respect to the anode, and an organic layer provided between the anode and the cathode. The organic layer has, for example, a hole injecting layer, a hole transporting layer, a light emitting layer, an electron transporting layer, and an electron injecting layer in this order from the anode side to the cathode side. An ink-jet coating device is used to form, for example, a light emitting layer.

The coating device disclosed in Japanese Patent Laid-Open Publication No. 2004-177262 has a receptacle configured to receive a functional liquid discharged from a functional droplet discharge head and an electronic balance configured to measure the mass of the functional liquid accumulated in the receptacle. The measurement result of the electronic balance is used to adjust the driving power (voltage value) of the functional droplet discharge head.

SUMMARY

In order to solve the above-described problem, according to an aspect of the present disclosure, there is provided a coating device for drawing a pattern of a functional liquid on a substrate. The coating device includes: a substrate holding unit which holds the substrate; a droplet discharging unit which discharges a droplet of the functional liquid on the substrate held by the substrate holding unit; a moving unit which relatively moves the substrate holding unit and the droplet discharging unit in a main scanning direction and a sub scanning direction on a base; a mass measuring unit including a cup which receives the droplet discharged by the droplet discharging unit and a mass measuring device which measures a mass of the functional liquid accumulated in the cup; and a liquid drain unit which drains the functional liquid accumulated in the cup from the cup.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
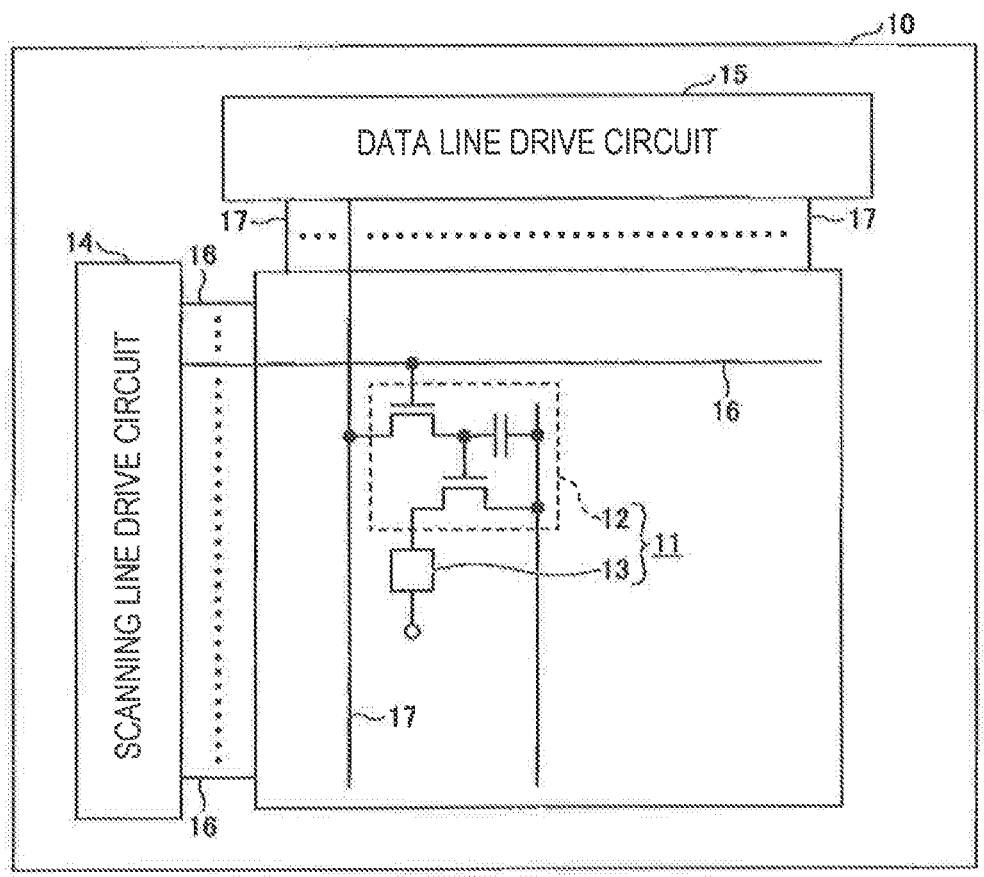
FIG. 1 is a plan view illustrating an organic EL display according to an exemplary embodiment.

In the following detailed description, reference is made to the accompanying drawings, which form a part thereof. The illustrative embodiments described in the detailed description, drawings, and claims are not meant to be limiting. Other exemplary embodiments may be utilized, and other changes may be made without departing from the spirit or scope of the subject matter presented here.

In the related art, when a cup that receives the functional liquid discharged from the discharge head is filled, the cup is exchanged by manual operation. At that time, a load is applied to a mass measuring device such as, for example, an electronic balance and the mass measuring device may be broken.

The present disclosure has been made in consideration of the above-described problem, and provides a coating device capable of suppressing breakage of a mass measuring device.

In order to solve the above-described problem, according to an aspect of the present disclosure, there is provided a coating device for drawing a pattern of a functional liquid on a substrate. The coating device includes: a substrate holding unit which holds the substrate; a droplet discharging unit which discharges a droplet of the functional liquid on the substrate held by the substrate holding unit; a moving unit which relatively moves the substrate holding unit and the droplet discharging unit in a main scanning direction and a sub scanning direction on a base; a mass measuring unit including a cup which receives the droplet discharged by the droplet discharging unit and a mass measuring device which measures a mass of the functional liquid accumulated in the cup; and a liquid drain unit which drains the functional liquid accumulated in the cup from the cup.

According to the aspect of the present disclosure, a coating device capable of suppressing breakage of the mass measuring device is provided.

Hereinafter, modes for implementing the present disclosure will be described with reference to the accompanying drawings. In the drawings, the same or corresponding components are denoted by the same or corresponding reference numerals, a repeated description thereof will be omitted.

<Organic EL Display>

FIG. 1 is a plan view illustrating an organic EL display according to an exemplary embodiment. In FIG. 1, a circuit of one unit circuit 11 is enlarged.

The organic EL display has a substrate 10, a plurality of unit circuits 11 arranged on the substrate 10, a scanning line driving circuit 14 provided on the substrate 10, and a data line driving circuit 15 provided on the substrate 10. A unit circuit 11 is provided in an area surrounded by a plurality of scanning lines 16 connected to the scanning line driving circuit 14 and a plurality of data lines 17 connected to the data line driving circuit 15. The unit circuit 11 includes a TFT layer 12 and an organic light emitting diode 13.

The TFT layer 12 has a plurality of thin film transistors (TFTs). One TFT has a function as a switching element and another TFT has a function as a current controlling element for controlling the amount of current flowing through the organic light emitting diode 13. The TFT layer 12 is operated by the scanning line driving circuit 14 and the data line driving circuit 15 to supply current to the organic light emitting diode 13. The TFT layer 12 is provided for each unit circuit 11, and a plurality of unit circuits 11 are independently controlled. Further, the TFT layer 12 may have a general configuration and is not limited to the configuration illustrated in FIG. 1.

In addition, in the present exemplary embodiment, a method of driving the organic EL display is an active matrix method, but may be a passive matrix method.

Figure 2:
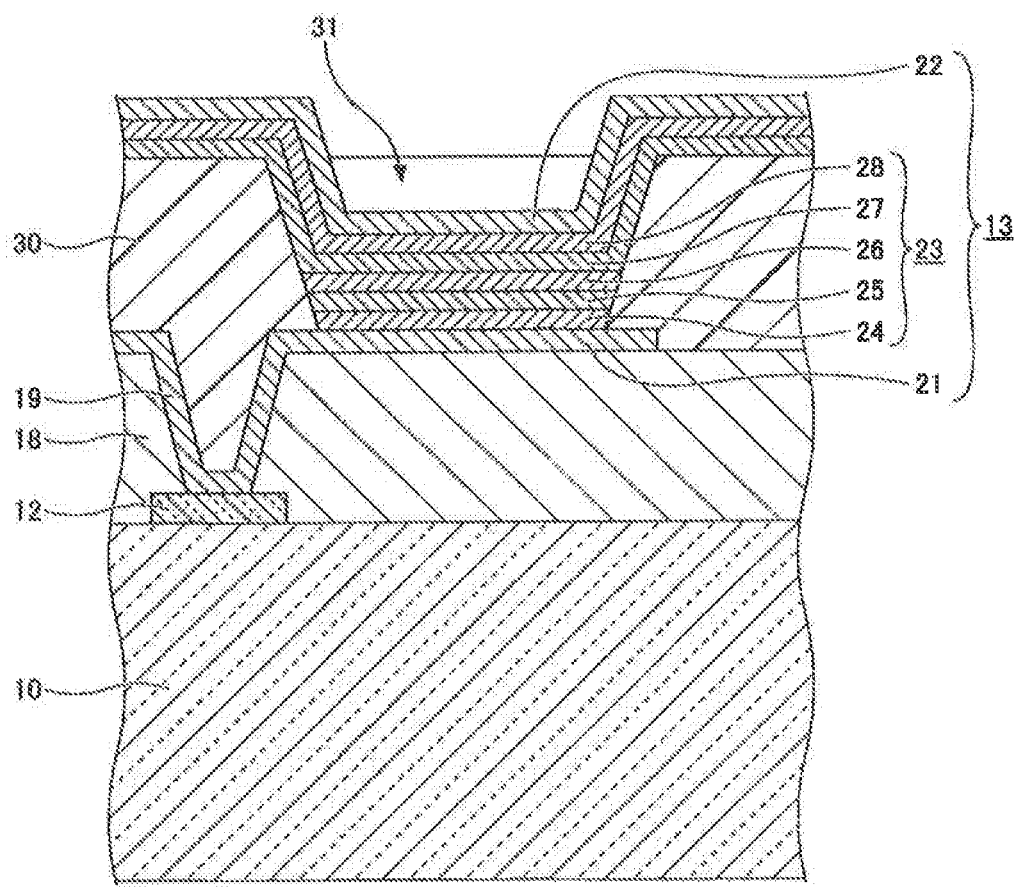
FIG. 2 is a cross-sectional view illustrating a main portion of the organic EL display according to the exemplary embodiment.

FIG. 2 is a cross-sectional view illustrating a main portion of the organic EL display according to the exemplary embodiment. As for the substrate 10, a transparent substrate such as a glass substrate or a resin substrate is used. The TFT layer 12 is formed on the substrate 10. On the TFT layer 12, a flattening layer 18 that flattens a step formed by the TFT layer 12 is formed.

The flattening layer 18 has an insulating property. A contact plug 19 is formed in a contact hole passing through the flattening layer 18. The contact plug 19 electrically connects the anode 21 as a pixel electrode formed on the flat surface of the flattening layer 18 and the TFT layer 12. The contact plug 19 may be formed of the same material as the anode 21 at the same time.

The organic light emitting diode 13 is formed on the flat surface of the flattening layer 18. The organic light emitting diode 13 includes an anode 21 as a pixel electrode, a cathode 22 as a counter electrode provided opposite to the substrate 10 with respect to the pixel electrode, and an organic layer 23 formed between the anode 21 and the cathode 22. By operating the TFT layer 12, a voltage is applied between the anode 21 and the cathode 22, and the organic layer 23 emits light.

The anode 21 is formed by, for example, indium tin oxide (ITO) and transmits light from the organic layer 23. Light transmitted through the anode 21 passes through the substrate 10 and is taken out to the outside. The anode 21 is provided for each unit circuit 11.

The cathode 22 is formed of, for example, aluminum, and reflects light from the organic layer 23 toward the organic layer 23. The light reflected by the cathode 22 is transmitted through the organic layer 23, the anode 21, and the substrate 10 and is taken out to the outside. The cathode 22 is common to a plurality of unit circuits 11.

The organic layer 23 has, for example, a hole injecting layer 24, a hole transporting layer 25, a light emitting layer 26, an electron transporting layer 27, and an electron injecting layer 28 in this order from the anode side 21 toward the cathode 22 side. When a voltage is applied between the anode 21 and the cathode 22, holes are injected from the anode 21 into the hole injecting layer 24, and electrons are injected from the cathode 22 into the electron injecting layer 28. The holes injected into the hole injecting layer 24 are transported to the light emitting layer 26 by the hole transporting layer 25. Further, the electrons injected into the electron injecting layer 28 are transported to the light emitting layer 26 by the electron transporting layer 27. Then, the holes and the electrons are recombined in the light emitting layer 26 to excite the light emitting material of the light emitting layer 26, and the light emitting layer 26 emits light.

As for the light emitting layer 26, for example, a red light emitting layer, a green light emitting layer, and a blue light emitting layer are formed. The red light emitting layer is formed of a red light emitting material, the green light emitting layer is formed of a green light emitting material, and the blue light emitting layer is formed of a blue light emitting material. The red light emitting layer, the green light emitting layer, and the blue light emitting layer are formed in an opening 31 of a bank 30.

The bank 30 separates the material liquid of the red light emitting layer, the material liquid of the green light emitting layer, and the material liquid of the blue light emitting layer from each other so as to prevent mixing thereof. The bank 30 has an insulating property and buries the contact hole penetrating the flattening layer 18.

<Method of Manufacturing Organic Light Emitting Diode>

Figure 3:
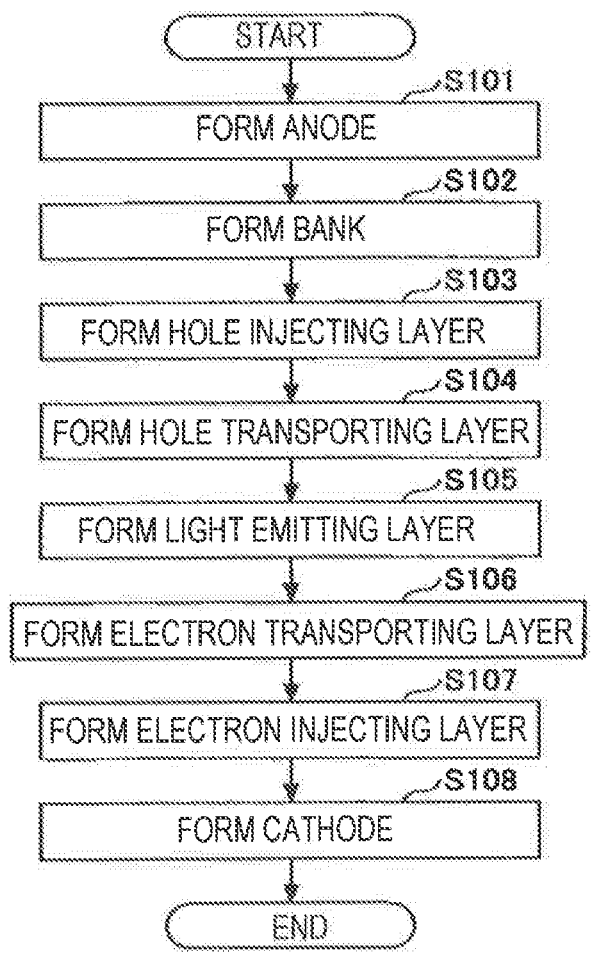
FIG. 3 is a flowchart illustrating a method of manufacturing an organic light emitting diode according to the exemplary embodiment.

FIG. 3 is a flowchart illustrating a method of manufacturing an organic light emitting diode according to the exemplary embodiment.

First, in step S101, the formation of the anode 21 as a pixel electrode is performed. For example, a deposition method is used to form the anode 21. The anode 21 is formed for each unit circuit 11 on the flat surface of the flattening layer 18. The contact plug 19 may be formed together with the anode 21.

In the subsequent step S102, the formation of the bank 30 is performed. The bank 30 is formed using, for example, a photo resist and patterned into a predetermined pattern by photolithographic processing. The anode 21 is exposed in the opening 31 of the bank 30.

Figure 4:
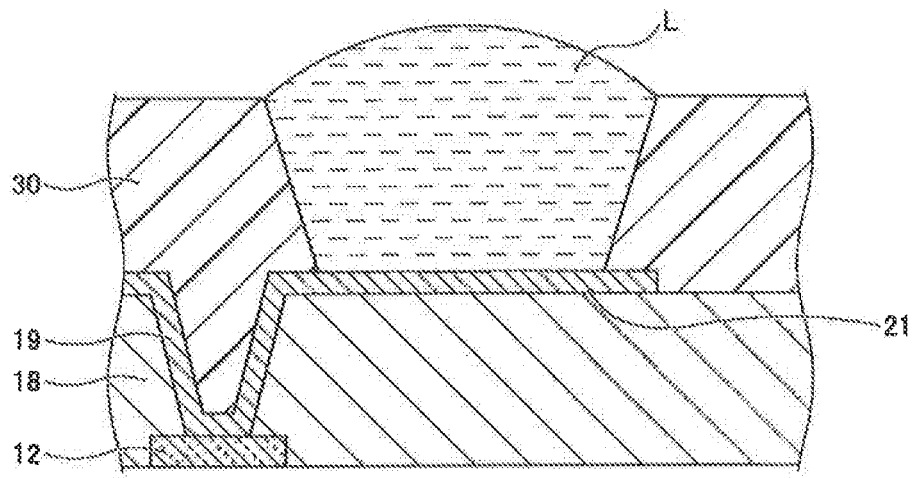
FIG. 4 is a cross-sectional view illustrating a substrate formed with a coating layer according to the exemplary embodiment.
Figure 5:
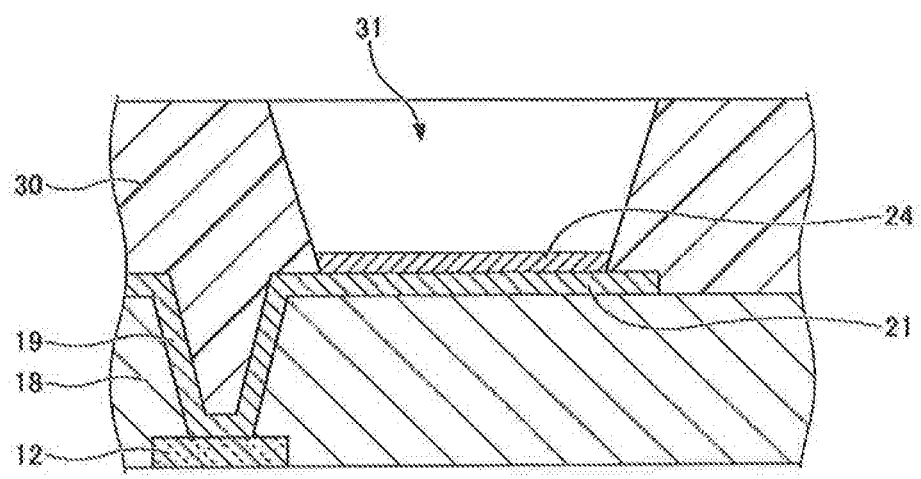
FIG. 5 is a cross-sectional view illustrating a substrate obtained by drying the coating layer of FIG. 4 under reduced pressure.

In the subsequent step S103, the formation of the hole injecting layer 24 is performed. For example, an ink-jet method is used to form the hole injecting layer 24. As illustrated in FIG. 4, a coating layer L is formed by applying the material liquid of the hole injecting layer 24 onto the cathode 21 by the ink-jet method. The coating layer L is dried and baked to form the hole injecting layer 24 as illustrated in FIG. 5.

In the subsequent step S104, the formation of the hole transporting layer 25 is performed. Similarly to the formation of the hole injecting layer 24, for example, the ink-jet method is used to form the hole transporting layer 25. A coating layer is formed by applying the material liquid of the hole transporting layer 25 onto the hole injecting layer 24 by the ink-jet method. The coating layer is dried and baked to form the hole transporting layer 25.

In the subsequent step S105, the formation of the light emitting layer 26 is performed. Similarly to the formation of the hole injecting layer 24 and the hole transporting layer 25, for example, the ink-jet method is used to form the light emitting layer 26. A coating layer is formed by applying the material liquid of the light emitting layer 26 onto the hole transporting layer 25 by the ink-jet method. The coating layer is dried and baked to form the light emitting layer 26.

As for the light emitting layer 26, for example, a red light emitting layer, a green light emitting layer, and a blue light emitting layer are formed. The red light emitting layer, the green light emitting layer, and the blue light emitting layer are formed in the opening 31 of the bank 30. The bank 30 separates the material liquid of the red light emitting layer, the material liquid of the green light emitting layer, and the material liquid of the blue light emitting layer from each other so as to prevent the mixing of these material liquids.

In the subsequent step S106, the formation of the electron transporting layer 27 is performed. For example, a vapor deposition method is used to form the electron transporting layer 27. The electron transporting layer 27 may be formed on the bank 30 as well as on the light emitting layer 26 in the opening 31 of the bank 30 because the electron transporting layer 27 may be common to a plurality of unit circuits 11.

In the subsequent step S107, the formation of the electron injecting layer 28 is performed. For example, a deposition method is used to form the electron injecting layer 28. The electron injecting layer 28 is formed on the electron transporting layer 27. The electron injecting layer 28 may be common to a plurality of unit circuits 11.

In the subsequent step S108, the formation of the cathode 22 is performed. For example, a deposition method is used to form the cathode 22. The cathode 22 is formed on the electron injecting layer 28. The cathode 22 may be common to a plurality of unit circuits 11.

Further, when the method of driving the organic EL display is not an active matrix method but a passive matrix method, the cathode 22 is patterned into a predetermined pattern.

The organic light emitting diode 13 is manufactured according to the above-described steps. A substrate processing system 100 is used to form the hole injecting layer 24, the hole transporting layer 25, and the light emitting layer 26 out of the organic layer 23.

<Substrate Processing System>

Figure 6:
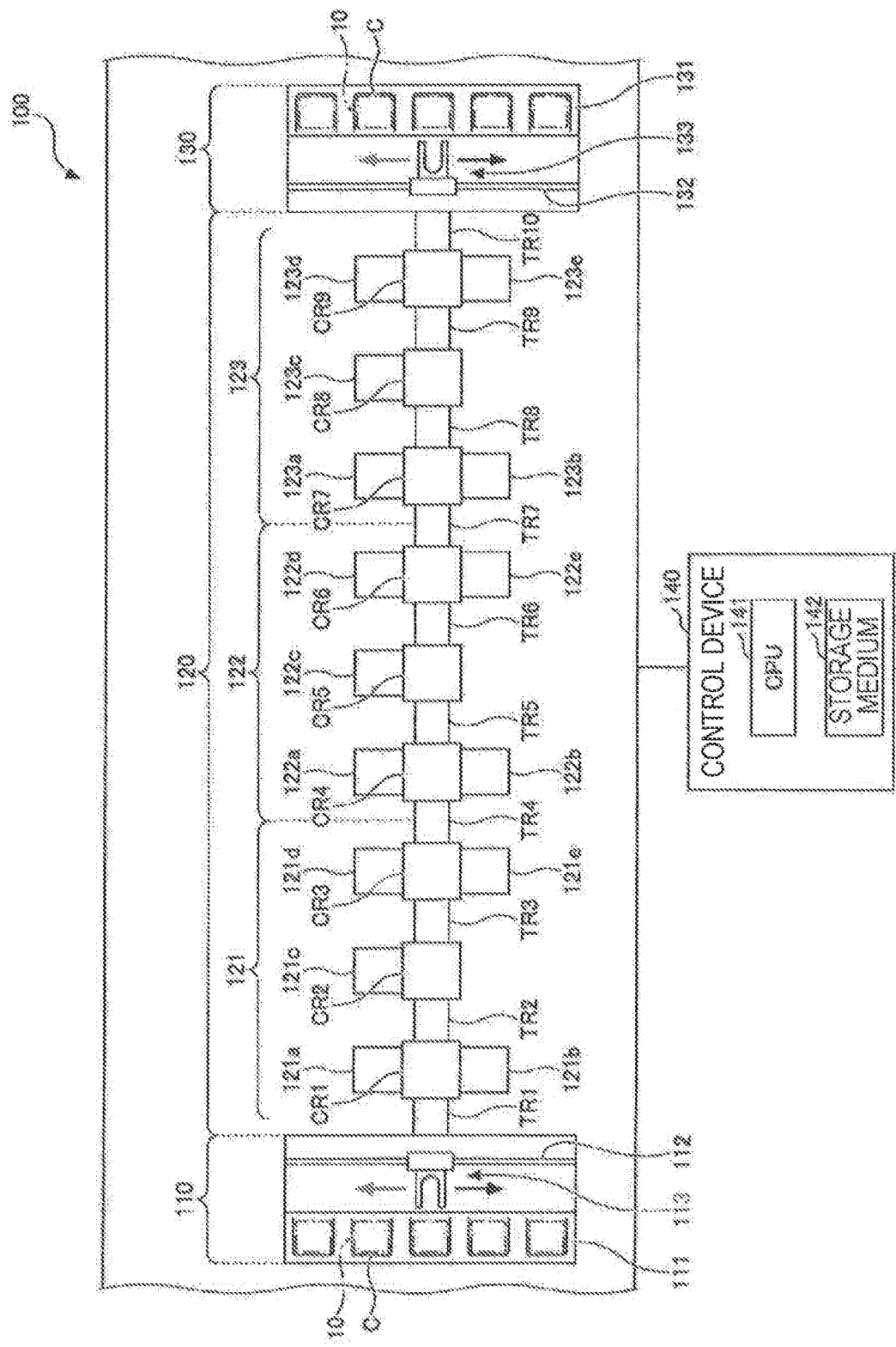
FIG. 6 is a plan view illustrating a substrate processing system according to the exemplary embodiment.

FIG. 6 is a plan view illustrating a substrate processing system according to the exemplary embodiment. The substrate processing system 100 performs the respective processes corresponding to steps S103 to S105 of FIG. 3 to form the hole injecting layer 24, the hole transporting layer 25, and the light emitting layer 26 on the anode 21. The substrate processing system 100 has a carry-in station 110, a processing station 120, a carry-out station 130, and a control device 140.

The carry-in station 110 is configured to carry therein a cassette C containing a plurality of substrates 10 from the outside and sequentially take out the plurality of substrates 10 from the cassette C. For example, the TFT layer 12, the flattening layer 18, the anode 21, and the bank 30 are formed in advance on each of the substrates 10.

The carry-in station 110 includes a cassette mounting stage 111 on which the cassette C is placed, a transport path 112 provided between the cassette mounting stage 111 and the processing station 120, and a substrate transport body 113 provided on the transport path 112. The substrate transport body 113 transports the substrate 10 between the cassette C placed on the cassette mounting stage 111 and the processing station 120.

The processing station 120 forms a hole injecting layer 24, a hole transporting layer 25, and a light emitting layer 26 on the anode 21. The processing station 120 includes a hole injecting layer formation block 121 that forms the hole injecting layer 24, a hole transporting layer formation block 122 that forms the hole transporting layer 25, and a light emitting layer formation block 123 that forms the light emitting layer 26.

The hole injecting layer formation block 121 forms a coating layer by applying the material liquid of the hole injecting layer 24 onto the anode 21, and dries and bakes the coating layer to form the hole injecting layer 24. The material liquid of the hole injecting layer 24 includes an organic material and a solvent. The organic material may be a polymer or a monomer. A monomer may be polymerized by baking to be turned into a polymer.

The hole injecting layer formation block 121 includes a coating device 121a, a buffering device 121b, a reduced pressure drying device 121c, a heat treating device 121d, and a temperature adjusting device 121e. The coating device 121a discharges the droplets of the material liquid of the hole injecting layer 24 toward the opening 31 of the bank 30. The buffering device 121b temporarily accommodates the substrate 10 waiting for processing. The reduced pressure drying device 121c dries the coating layer applied by the coating device 121a under reduced pressure so as to remove the solvent contained in the coating layer. The heat treating device 121d heats the coating layer dried by the reduced pressure drying device 121c. The temperature adjusting device 121e adjusts the temperature of the substrate 10 subjected to the heat treatment by the heat treating device 121d to a predetermined temperature, for example, room temperature.

The inside of the coating device 121a, the buffering device 121b, the heat treating device 121d, and the temperature adjusting device 121e is maintained in an atmospheric atmosphere. The reduced pressure drying device 121c switches the internal atmosphere between an atmospheric atmosphere and a depressurized atmosphere.

Further, in the hole injecting layer formation block 121, the arrangement, number, and internal atmosphere of the coating device 121a, the buffering device 121b, the reduced pressure drying device 121c, the heat treating device 121d, and the temperature adjusting device 121e may be arbitrarily selected.

In addition, the hole injecting layer formation block 121 includes substrate transporting devices CR1 to CR3 and transferring devices TR1 to TR3. The substrate transporting devices CR1 to CR3 transport the substrate 10 to the respective adjacent devices. For example, the substrate transporting device CR1 transports the substrate 10 to the adjacent coating device 121a and the adjacent buffering device 121b. The substrate transporting device CR2 transports the substrate 10 to the adjacent reduced pressure drying device 121c. The substrate transporting device CR3 transports the substrate 10 to the adjacent heat treating device 121d and the adjacent temperature adjusting device 121e. The transferring devices TR1 to TR3 are respectively provided in order between the carry-in station 110 and the substrate transporting device CR1, between the substrate transporting device CR1 and the substrate transporting device CR2, and between the substrate transporting device CR2 and the substrate transporting device CR3, and the substrate 10 is relayed between these components. The inside of the substrate transporting devices CR1 to CR3 and the transferring devices TR1 to TR3 is maintained in an atmospheric atmosphere.

A transferring device TR4 is provided between the substrate transporting device CR3 of the hole injecting layer formation block 121 and the substrate transporting device CR4 of the hole transporting layer formation block 122 to relay the substrate 10 therebetween. The inside of the transferring device TR4 is maintained in an atmospheric atmosphere.

The hole transporting layer formation block 122 forms a coating layer by applying the material liquid of the hole transporting layer 25 onto the hole injecting layer 24, and dries and bakes the coating layer to form the hole transporting layer 25. The material liquid of the hole transporting layer 25 includes an organic material and a solvent. The organic material may be a polymer or a monomer. A monomer may be polymerized by baking to be turned into a polymer.

The hole transporting layer formation block 122 includes a coating device 122a, a buffering device 122b, a reduced pressure drying device 122c, a heat treating device 122d, and a temperature adjusting device 122e. The coating device 122a discharges the droplets of the material liquid of the hole transporting layer 25 toward the opening 31 of the bank 30. The buffering device 122b temporarily accommodates the substrate 10 waiting for processing. The reduced pressure drying device 122c dries the coating layer applied by the coating device 122a under reduced pressure to remove the solvent contained in the coating layer. The heat treating device 122d heats the coating layer dried by the reduced pressure drying device 122c. The temperature adjusting device 122e adjusts the temperature of the substrate 10 subjected to the heat treatment by the heat treating device 122d to a predetermined temperature (e.g., room temperature).

The inside of the coating device 122a and the buffering device 122b is maintained in an atmospheric atmosphere. In the meantime, the inside of the heat treating device 122d and the temperature adjusting device 122e is maintained in a low oxygen and low dew point atmosphere in order to suppress the deterioration of the organic material of the hole transporting layer 25. The reduced pressure drying device 122c switches the internal atmosphere between a low oxygen and low dew point atmosphere and a depressurized atmosphere.

Here, the low-oxygen atmosphere refers to an atmosphere in which the oxygen concentration is lower than that in the atmosphere (e.g., an atmosphere having an oxygen concentration of 10 ppm or less). Further, the low dew point atmosphere refers to an atmosphere in which the dew point temperature is lower than that in the atmosphere (e.g., an atmosphere having a dew point temperature of −10° C. or less). The low oxygen and low dew point atmosphere is formed by an inert gas such as nitrogen gas.

Further, in the hole transporting layer formation block 122, the arrangement, number, and internal atmosphere of the coating device 122a, the buffering device 122b, the reduced pressure drying device 122c, the heat treating device 122d, and the temperature adjusting device 122e may be arbitrarily selected.

In addition, the hole transporting layer formation block 122 includes substrate transporting devices CR4 to CR6 and transferring devices TR5 and TR6. The substrate transporting devices CR4 to CR6 transport the substrate 10 to the respective adjacent devices. The transferring devices TR5 and TR6 are respectively provided in order between the substrate transporting device CR4 and the substrate transporting device CR5, and between the substrate transporting device CR5 and the substrate transporting device CR6, and the substrate 10 is relayed therebetween.

The inside of the substrate transporting device CR4 is maintained in an atmospheric atmosphere. In the meantime, the inside of the substrate transporting devices CR5 and CR6 is maintained in a low oxygen and low dew point atmosphere. This is because the inside of the reduced pressure drying device 122c adjacent to the substrate transporting device CR5 is switched between the low oxygen and low dew point atmosphere and the depressurized atmosphere. In addition, the inside of the heat treating device 122d and the temperature adjusting device 122e provided adjacent to the substrate transporting device CR6 is maintained in a low oxygen and low dew point atmosphere.

The transferring device TR5 is configured as a load lock device that switches the internal atmosphere between the atmospheric atmosphere and the low oxygen and low dew point atmosphere. This is because the reduced pressure drying device 122c is provided adjacent to the downstream side of the transferring device TR6. In the meantime, the inside of the transferring device TR6 is maintained in the low oxygen and low dew point atmosphere.

A transferring device TR7 is provided between the substrate transporting device CR6 of the hole transporting layer formation block 122 and the substrate transporting device CR7 of the light emitting layer formation block 123 to relay the substrate 10 therebetween. The inside of the substrate transporting device CR6 is maintained in the low oxygen and low dew point atmosphere, and the inside of the substrate transporting device CR7 is maintained in the atmospheric atmosphere. Therefore, the transferring device TR7 is configured as a load lock device that switches the internal atmosphere between the low oxygen and low dew point atmosphere and the atmospheric atmosphere.

The light emitting layer formation block 123 forms a coating layer by applying the material liquid of the light emitting layer 26 onto the hole transporting layer 25, and dries and bakes the coating layer to form the light emitting layer 26. The material liquid of the light emitting layer 26 includes an organic material and a solvent. The organic material may be a polymer or a monomer. A monomer may be polymerized by baking to be turned into a polymer.

The light emitting layer formation block 123 includes a coating device 123a, a buffering device 123b, a reduced pressure drying device 123c, a heat treating device 123d, and a temperature adjusting device 123e. The coating device 123a discharges the droplets of the material liquid of the light emitting layer 26 toward the opening 31 of the bank 30. The buffering device 123b temporarily accommodates the substrate 10 waiting for processing. The reduced pressure drying device 123c dries the coating layer applied by the coating device 123a under reduced pressure to remove the solvent contained in the coating layer. The heat treating device 123d heats the coating layer dried by the reduced pressure drying device 123c. The temperature adjusting device 123e adjusts the temperature of the substrate 10 subjected to the heat treatment by the heat treating device 123d to a predetermined temperature (e.g., room temperature).

The inside of the coating device 123a and the buffering device 123b is maintained in the atmospheric atmosphere. In the meantime, the inside of the heat treating device 123d and the temperature adjusting device 123e is maintained in the low oxygen and low dew point atmosphere in order to suppress the deterioration of the organic material of the light emitting layer 26. The reduced pressure drying device 123c switches the internal atmosphere between the low oxygen and low dew point atmosphere and a depressurized atmosphere.

Further, in the light emitting layer formation block 123, the arrangement, number, and internal atmosphere of the coating device 123a, the buffering device 123b, the reduced pressure drying device 123c, the heat treating device 123d, and the temperature adjusting device 123e may be arbitrarily selected.

In addition, the light emitting layer formation block 123 includes substrate transporting devices CR7 to CR9 and transferring devices TR8 and TR9. The substrate transporting devices CR7 to CR9 transport the substrate 10 to the respective adjacent devices. The transferring devices TR8 and TR9 are respectively provided in order between the substrate transporting device CR7 and the substrate transporting device CR8, and between the substrate transporting device CR8 and the substrate transporting device CR9, and the substrate 10 is relayed between these components.

The inside of the substrate transporting device CR7 is maintained in the atmospheric atmosphere. In the meantime, the inside of the substrate transporting devices CR8 and CR9 is maintained in the low oxygen and low dew point atmosphere. This is because the inside of the reduced pressure drying device 123c adjacent to the substrate transporting device CR8 is switched between the low oxygen and low dew point atmosphere and the depressurized atmosphere. In addition, the inside of the heat treating device 123d and the temperature adjusting device 123e provided adjacent to the substrate transporting device CR9 is maintained in the low oxygen and low dew point atmosphere.

The transferring device TR8 is configured as a load lock device that switches the internal atmosphere between the atmospheric atmosphere and the low oxygen and low dew point atmosphere. This is because the reduced pressure drying device 123c is provided adjacent to the downstream side of the transferring device TR8. The inside of the transferring device TR9 is maintained in the low oxygen and low dew point atmosphere.

A transferring device TR10 is provided between the substrate transporting device CR9 of the light emitting layer formation block 123 and the carry-out station 130 to relay the substrate 10 therebetween. The inside of the substrate transporting device CR9 is maintained in the low oxygen and low dew point atmosphere, and the inside of the carry-out station 130 is maintained in the atmospheric atmosphere. Therefore, the transferring device TR7 is configured as a load lock device that switches the internal atmosphere between the low oxygen and low dew point atmosphere and the atmospheric atmosphere.

The carry-out station 130 sequentially accommodates a plurality of substrates 10 in the cassette C and carries out the cassette C to the outside. The carry-in station 130 includes a cassette mounting stage 131 on which the cassette C is placed, a transport path 132 provided between the cassette mounting stage 131 and the processing station 120, and a substrate transport body 133 provided on the transport path 132. The substrate transport body 133 transports the substrate 10 between the processing station 120 and the cassette C placed on the cassette mounting stage 131.

The control device 140 includes a computer including a central processing unit (CPU) 141 and a storage medium 142 such as a memory, and executes a program (also referred to as a recipe) stored in the storage medium 142 to perform various processes.

The program of the control device 140 is stored in an information storage medium and installed from the information storage medium. The information storage medium may be, for example, a hard disc (HD), a flexible disc (FD), a compact disc (CD), a magnet optical disc (MO), or a memory card. The program may also be downloaded from the server via the Internet and installed.

Next, a substrate processing method using the substrate processing system 100 of the above-described configuration will be described. When the cassette C accommodating the plurality of substrates 10 is placed on the cassette mounting stage 111, the substrate transport body 113 sequentially takes out the substrates 10 from the cassette C on the cassette mounting stage 111 and transports the substrates 10 to the hole injecting layer formation block 121.

The hole injecting layer formation block 121 forms a coating layer by applying the material liquid of the hole injecting layer 24 onto the anode 21, and dries and bakes the coating layer to form the hole injecting layer 24. The substrate 10 on which the hole injecting layer 24 is formed is transferred by the transferring device TR4 from the hole injecting layer formation block 121 to the hole transporting layer formation block 122.

The hole transporting layer formation block 122 forms a coating layer by applying the material liquid of the hole transporting layer 25 onto the hole injecting layer 24, and dries and bakes the coating layer to form the hole transporting layer 25. The substrate 10 on which the hole transporting layer 25 is formed is transferred by the transferring device TR7 from the hole transporting layer formation block 122 to the light emitting layer formation block 123.

The light emitting layer formation block 123 forms a coating layer by applying the material liquid of the light emitting layer 26 onto the hole transporting layer 25, and dries and bakes the coating layer to form the light emitting layer 26. The substrate 10 on which the light emitting layer 26 is formed is transferred by the transferring device TR10 from the light emitting layer formation block 123 to the carry-out station 130.

The substrate transport body 133 of the carry-out station 130 accommodates the substrate 10 received by the transferring device TR10 in a predetermined cassette C on the cassette mounting stage 131. By this, a series of processes by the substrate 10 in the substrate processing system 100 are completed.

The substrate 10 is carried out from the carry-out station 130 to the outside in a state of being accommodated in the cassette C. For example, the electron transporting layer 27, the electron injecting layer 28, and the cathode 22 are formed on the substrate 10 carried out to the outside.

<Coating Device and Coating Method>

Figure 7:
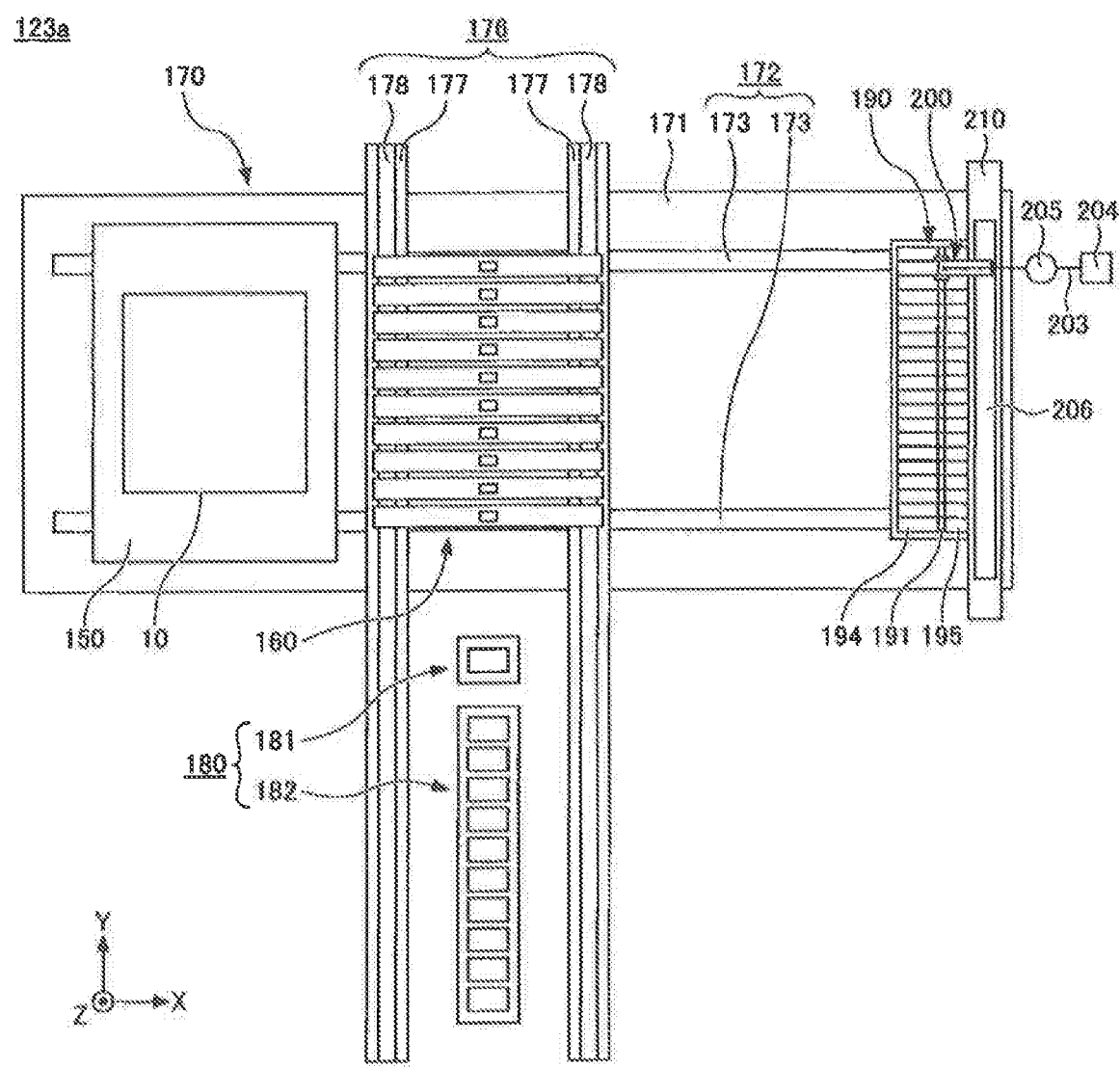
FIG. 7 is a plan view illustrating a coating device according to the exemplary embodiment.
Figure 8:
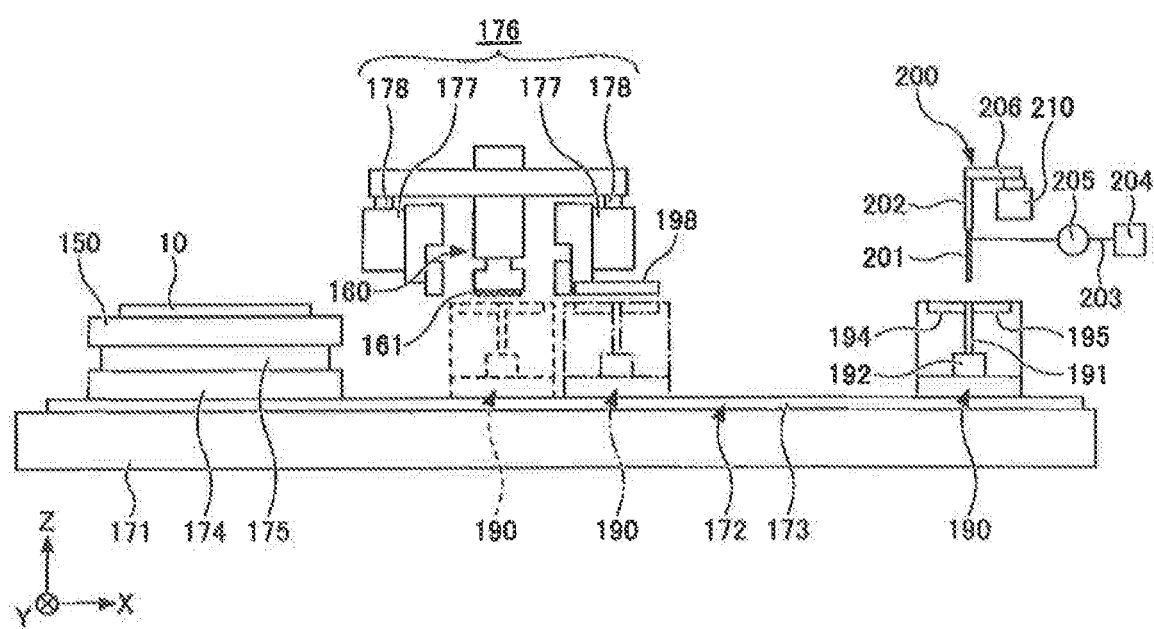
FIG. 8 is a side view illustrating the coating device according to the exemplary embodiment.

Next, the coating device 123a of the light emitting layer formation block 123 will be described with reference to FIGS. 7 and 8. FIG. 7 is a plan view illustrating a coating device according to the exemplary embodiment. FIG. 8 is a side view illustrating the coating device according to the exemplary embodiment. In the following figure, the X direction is the main scanning direction, the Y direction is the sub scanning direction, and the Z direction is the vertical direction. The X direction and the Y direction are horizontal directions and orthogonal to each other. Further, the X direction and the Y direction may or may not intersect with each other.

The coating device 123a draws the pattern of the functional liquid on the substrate 10 by moving the position of the droplet of the functional liquid (e.g., the material liquid of the light emitting layer 26) on the substrate 10 in the X direction and the Y direction. The coating device 123a includes, for example, a substrate holding unit 150 configured to hold the substrate 10, a droplet discharging unit 160 configured to discharge droplets of the functional liquid on the substrate 10 held by the substrate holding unit 150, and a moving unit 170 configured to relatively move the substrate holding unit 150 and the droplet discharging unit 160 in the X direction and the Y direction. The coating device 123a also includes a maintenance unit 180 configured to perform a process for maintaining the function of the droplet discharging unit 160.

The substrate holding unit 150 holds the substrate 10 in the state where an application surface of the substrate 10 which will be applied with the droplets faces upward. As for the substrate holding unit 150, for example, a vacuum chuck is used, but an electrostatic chuck or the like may be used.

The droplet discharging unit 160 discharges droplets of the functional liquid toward the substrate 10 held by the substrate holding unit 150. A plurality of (e.g., ten in FIG. 7) droplet discharging units 160 are arranged in the Y direction. The plurality of droplet discharging units 160 may be independently moved in the Y direction or may be integrally moved in the Y direction.

Each of the droplet discharging units 160 has a plurality of discharge heads 161 (see, e.g., FIG. 8). Each of the discharge heads 161 has a discharge nozzle row including a plurality of discharge nozzles arranged in the Y direction. Each discharge head 161 may have a plurality of discharge nozzle rows on its lower surface.

Each discharge head 161 has a piezo element at every discharge nozzle. When a voltage is applied to the piezo element, the piezo element deforms and droplets are discharged from the discharge nozzles. A heater or the like may be used in place of the piezo element. When a voltage is applied to the heater, a bubble is generated, and the droplet is discharged from the discharge nozzle by the pressure of the generated bubble.

Each droplet discharge unit 160 may discharge a plurality of types of functional liquids. The plurality of types of functional liquids may be, for example, the material liquid of the red light emitting layer, the material liquid of the green light emitting layer, and the material liquid of the blue light emitting layer. A plurality of discharge nozzles provided in the same discharge head 161 discharge droplets of the same type of functional liquid.

Figure 9:
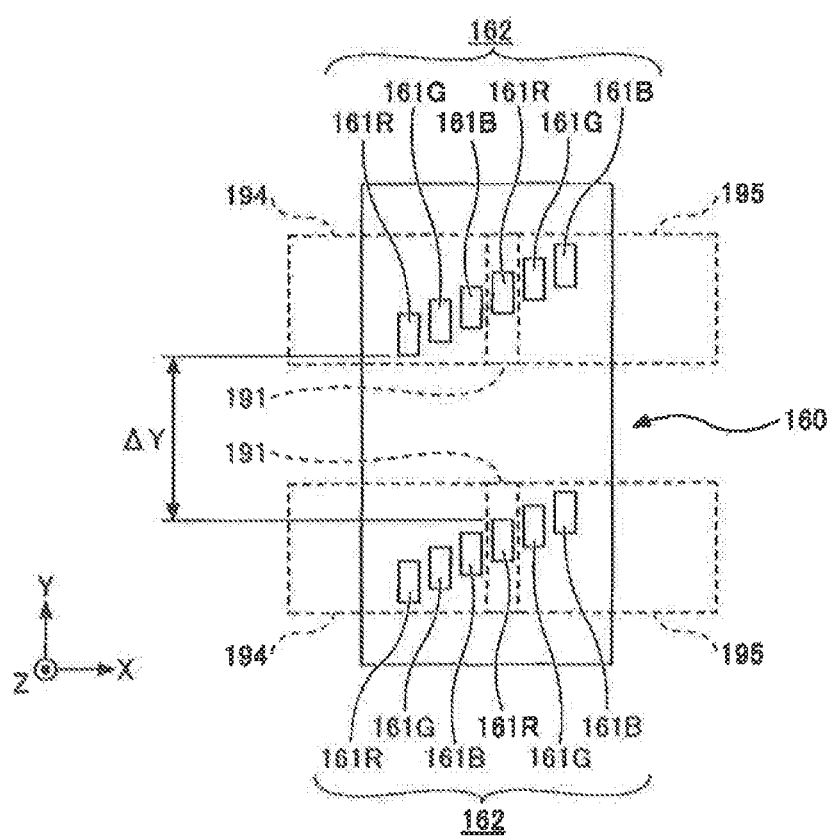
FIG. 9 is a plan view illustrating the arrangement of a discharge head and the position of a cup when receiving droplets from the discharge head of a discharge amount measurement target according to the exemplary embodiment.

FIG. 9 is a plan view illustrating the arrangement or the like of a discharge head according to the exemplary embodiment. The droplet discharging unit 160 has two discharge head rows 162 arranged in the Y direction. Each discharge head row 162 includes six discharge heads 161 arranged in a stepwise manner in the X direction. Each of the discharge head rows 162 includes two discharge heads 161R configured to discharge droplets of the material liquid of the red light emitting layer, two discharge heads 161G configured to discharge droplets of the material liquid of the green light emitting layer, and two discharge heads 161B configured to discharge droplets of the material liquid of the blue light emitting layer.

The moving unit 170 (see, e.g., FIG. 7) relatively moves the substrate holding unit 150 and the droplet discharging unit 160 in the X direction and the Y direction.

For example, the moving unit 170 has an X-direction moving unit 172 that moves the substrate holding unit 150 in the X direction with respect to a base 171. The X-direction moving unit 172 includes, for example, a pair of X-axis guides 173 provided on the base 171 and a pair of X-axis linear motors for moving the substrate holding unit 150 along the pair of X-axis guides 173.

Further, the moving unit 170 includes a first Y-direction moving unit 174 that moves the substrate holding unit 150 in the Y direction with respect to the base 171 (see, e.g., FIG. 8) and a θ-direction moving unit 175 that rotates the substrate holding unit 150 around a straight line passing through the center of the substrate holding unit 150 (see, e.g., FIG. 8).

In addition, the moving unit 170 has a second Y-direction moving unit 176 that moves the droplet discharging unit 160 in the Y direction with respect to the base 171. The second Y-direction moving unit 176 includes, for example, a pair of Y-axis beams 177 crossing over the base 171, a pair of Y-axis guides 178 provided on the pair of Y-axis beams 177, and a pair of Y-axis linear motors that move the droplet discharging unit 160 along the pair of Y-axis guides 178.

The second Y-direction moving unit 176 moves the droplet discharging unit 160 between a position where the droplets of the functional liquid are discharged onto the substrate 10 held by the substrate holding unit 150 and a position where a process for maintaining the function by the maintenance unit 180 is received.

The maintenance unit 180 performs a process of maintaining the function of the droplet discharging unit 160 to resolve the discharge failure of the droplet discharging unit 160. The maintenance unit 180 has a wiping unit 181 that wipes out the periphery of a discharge port of the discharge nozzle and a sucking unit 182 that sucks droplets from the discharge port of the discharge nozzle. The sucking unit 182 blocks the discharge port of the discharge nozzle in an idle state to suppress clogging due to drying.

Next, a coating method using the coating device 123a of the above-described configuration will be described. The following operation of the coating device 123a is controlled by the control device 140. The control device 140 is provided separately from the coating device 123a in FIG. 6, but may be provided as a portion of the coating device 123a.

First, when a robot (not illustrated) carries the substrate 10 into the coating device 123a from the outside of the coating device 123a, the coating device 123a protrudes a lifting pin from the upper surface of the substrate holding unit 150 to receive the substrate 10 from the robot with the lifting pin. Thereafter, the coating device 123a lowers the lifting pin to hold the substrate 10 on the upper surface of the substrate holding unit 150.

Subsequently, the moving unit 170 corrects the position of the substrate 10 based on the image of the alignment mark of the substrate 10 held by the substrate holding unit 150. Position correction of the substrate 10 is performed by rotating the substrate holding unit 150 around the Z-axis and moving the substrate holding unit 150 in parallel with the X direction and the Y direction.

Thereafter, the moving unit 170 allows the substrate 10 held by the substrate holding unit 150 to pass under the droplet discharging unit 160 by moving the substrate 10 in the X direction. While the substrate 10 passes under the droplet discharging unit 160, the droplet discharging unit 160 discharges droplets toward the substrate 10.

Subsequently, the moving unit 170 moves the substrate 10 held by the substrate holding unit 150 in the Y direction. The reason why the substrate 10 is moved in the Y direction is that, as illustrated in FIG. 9, there is a gap ΔY between a plurality of discharge heads 161 which discharge the same type of functional liquid. By moving the substrate 10 in the Y direction, droplets of a specific type of functional liquid may be deposited on the entire Y direction of the substrate 10. Further, the reason why the substrate 10 is moved in the Y direction instead of the droplet discharging unit 160 is to prevent the functional liquid contained in the droplet discharging unit 160 from swinging.

Thereafter, the moving unit 170 allows the substrate 10 held by the substrate holding unit 150 to pass under the droplet discharging unit 160 once again by moving the substrate 10 in the X direction. While the substrate 10 passes under the droplet discharging unit 160, the droplet discharging unit 160 discharges droplets toward the substrate 10.

As described above, the coating device 123*a* draws the pattern of the functional liquid on the substrate 10 by alternately repeating the movement of the substrate 10 by the moving unit 170 in the X direction, the load of droplets by the droplet discharging unit 160, and the movement of the substrate 10 in the Y direction by the moving unit 170.

After completion of the drawing, the coating device 123*a* releases the holding of the substrate 10 by the substrate holding unit 150, lifts the substrate 10 from the substrate holding unit 150 by a lifting pin, and transfers the substrate 10 to a robot. Thereafter, the robot carries out the substrate 10 from the inside of the coating device 123*a* to the outside of the coating device 123*a*.

Thereafter, the robot carries the next substrate 10 from the outside of the coating device 123*a* into the coating device 123*a*, the coating device 123*a* draws the pattern of the function liquid on the substrate 10, and the robot carries the substrate 10 from the inside of the coating device 123*a* to the outside of the coating device 123*a*. These steps are repeatedly performed.

In addition, a process of maintaining the function of the droplet discharging unit 160 by the maintenance unit 180 is properly performed, for example, during the replacement of the substrate 10.

Further, the moving unit 170 of the above-described configuration moves the substrate holding unit 150 in order to draw a predetermined pattern on the substrate 10. However, the droplet discharging unit 160 may be moved, and both the substrate holding unit 150 and the droplet discharging unit 160 may be moved.

<Mass Measuring Unit>

As illustrated in FIG. 7 or 8, the coating device 123*a* has a mass measuring unit 190 used for measuring the discharge amount of the droplet discharging unit 160. In FIG. 8, the position of the mass measuring unit 190 when the droplets of the functional liquid discharged by the droplet discharging unit 160 are received by the cup 191 is indicated by a broken line, the position of the mass measuring unit 190 when measuring the mass of the functional liquid accumulated in the cup 191 is indicated by a two-dot chain line, and the position of the mass measuring unit 190 when discharging the functional liquid accumulated in the cup 191 from the cup 191 is indicated by a solid line.

The mass measuring unit 190 is provided for each of the discharge head rows 162 (see, e.g., FIG. 9), and measures a plurality of (e.g., six) discharge heads 161 constituting the discharge head rows 162 one by one in order. Further, when each discharge head 161 has a plurality of discharge nozzle rows, the discharge amount measurement may be performed in units of discharge nozzle rows.

A plurality of (e.g., twenty in FIG. 7) mass measuring units 190 are arranged in the Y direction. A plurality of mass measuring units 190 arranged in the Y direction are integrated and movable along a pair of X-axis guides 173. The pair of X-axis guides 173 are common to the mass measuring unit 190 and the substrate holding unit 150. The mass measuring unit 190 and the substrate holding unit 150 may be independently moved in the X direction or may be integrally moved in the X direction.

Figure 10:
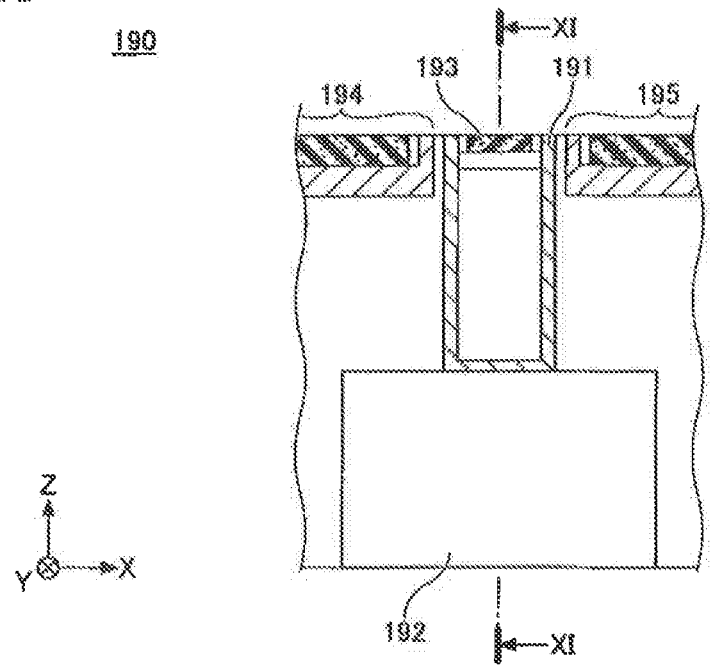
FIG. 10 is a cross-sectional view illustrating the structure of the cup according to the exemplary embodiment.

Each of the mass measuring units 190 has a cup 191 that receives droplets of the functional liquid discharged by the discharge head 161 and a mass measuring device 192 that measure the mass of the function liquid accumulated in the cup 191. The cup 191 is opened upward, and accumulates the droplets falling from above therein. A porous resin body 193 (see, e.g., FIGS. 10 and 11) is provided in the opening of the cup 191 to prevent the droplets falling from above from recoiling. As for the mass measuring device 192, for example, an electronic balance is used.

When the cup 191 receives droplets of the functional liquid discharged by the droplet discharging unit 160, the mass measuring unit 190 is moved to the lower side of the droplet discharging unit 160 as illustrated by a broken line in FIG. 8. The cup 191 receives the droplets from one discharge head 161, which is the target of the discharge amount measurement. Flushing boxes 194 and 195 may be provided on both sides of the cup 191 in the X direction to receive test discharges from the discharge heads 161 other than the remaining discharge amount measurement targets. These flushing boxes 194 and 195 may receive test discharges from the discharge head 161 at times other than during the measurement of the discharge amount.

In the meantime, when the mass measuring device 192 measures the mass of the functional liquid accumulated in the cup 191, the mass measuring unit 190 is moved to the lower side of a wind shielding member 198 as illustrated by a two-dot chain line in FIG. 8. The wind shielding member 198 prevents a downflow or the like formed in a coating device 123*a* from contacting the mass measuring unit 190. Thus, the mass may be accurately measured.

The mass measuring device 192 transmits the measurement result to a control device 140. The control device 140 measures the discharge amount of the discharge head 161 from the measurement result of the mass measuring device 192 and adjusts the drive voltage of the discharge head 161 based on the measured discharge amount. The measurement of the discharge amount and the adjustment of the drive voltage may be performed before drawing or regularly. Hereinafter, the operation of the coating device 123*a* for the discharge amount measurement and the drive voltage adjustment will be described. The following operation of the coating device 123*a* is performed under control by the control device 140.

First, the X-direction moving unit 172 moves each cup 191 of each mass measuring unit 190 to a position directly below a first discharge head 161 of each discharge head row 162. Subsequently, the first discharge head 161 discharges droplets from all of the discharge nozzles. Thereafter, the X-direction moving unit 172 moves each cup 191 to the position directly below the wind shielding member 198. In this state, each mass measuring device 192 measures the discharge amount of the first discharge head 161.

When the discharge amount of the first discharge head 161 is within the target range, the control device 140 does not correct the drive voltage of the first discharge head 161.

In the meantime, when the discharge amount of the first discharge head 161 is outside the target range, the drive voltage of the first discharge head 161 is corrected, the discharge is performed again with the corrected drive voltage, and the discharge amount measurement is performed again. The measurement of the discharge amount and the correction of the drive voltage are repeatedly performed until the measurement result of the discharge amount falls within the target range.

Further, each of the mass measuring units 190 may measure the discharge amount in units of discharge nozzle rows as described above. In this case, the first discharge head 161 discharges droplets in units of discharge nozzle rows, each of the mass measuring devices 192 measures the discharge amount in units of discharge nozzle rows, and the control device 140 corrects the drive voltage in units of discharge nozzle rows.

Thereafter, the X-direction moving unit 172 moves each cup 191 of each mass measuring unit 190 to a position directly below a second discharge head 162 of each discharge head row 162. The discharge amount measurement of the second discharge head 161 and the adjustment of the drive voltage are performed in the same manner. The discharge amount measurements of the third to sixth discharge heads 161 and the adjustment of the drive voltage are performed in the same manner.

Each of the discharge head rows 162 includes a discharge head 161R configured to discharge droplets of the material liquid of the red light emitting layer, a discharge head 161G configured to discharge droplets of the material liquid of the green light emitting layer, and a discharge head 161R configured to discharge droplets of the material liquid of the blue light emitting layer. Therefore, each cup 191 mixes and accumulates a plurality of types of functional liquids.

<Liquid Drain Unit>

As illustrated in FIG. 7 or 8, the coating device 123a has a liquid drain unit 200 that drains the functional liquid accumulated in the cup 191 from the cup 191. Hereinafter, the draining of the functional liquid from the cup 191 by the liquid drain unit 200 is referred to as a "draining process."

According to the present exemplary embodiment, since the liquid drain unit 200 performs the draining process, the manual operation of replacing the cup 191, which is required in the related art, becomes unnecessary. Therefore, it is possible to prevent the mass measuring device 192 from being damaged because the load is not erroneously applied to the mass measuring device 192 when the cup 192 is replaced.

Further, according to the present exemplary embodiment, since the cup 191 may be firmly coupled to the mass measuring device 192 with a screw or the like, vibration due to insufficient coupling between the cup 191 and the mass measuring device 192 may be suppressed and the mass may be accurately measured. In addition, in the related art, since the cup 191 was removably attached to the mass measuring device 192, such as a plate spring instead of a screw, vibration was easily generated due to the downflow formed in the coating device 123a.

Further, according to the present exemplary embodiment, since the space for replacing the cup 191 becomes unnecessary, the capacity of the cup 191 may be increased and the frequency of the draining process may be reduced. Thus, it is possible to shorten the time for stopping the drawing process for the draining process and improve the operation rate of the coating device 123a. Further, as will be described later, the draining process may be performed during the maintenance process. The maintenance process refers to a process for maintaining the function of the droplet discharging unit 160 by the maintenance unit 180.

Further, according to the present exemplary embodiment, it is not necessary to check the position of the cup 191 in order to avoid collision between the discharge head 161 and the cup 191 each time the cup 191 is replaced. This eliminates the need for a position sensor or the like to check the position of the cup 191. In addition, collision between the discharge head 161 and the cup 191 due to the failure of the position sensor may be avoided.

The liquid drain unit 200 includes, for example, a sucking nozzle 201 which is inserted into the cup 191 to suck the functional liquid accumulated in the cup 191 and a lifting mechanism 202 which lifts and lowers the sucking nozzle 201. A piping 203 for drainage may be connected to the sucking nozzle 201 instead of the cup 191 and the piping 203 may be designed without considering the movement of the cup 191. It is also possible to connect the piping 203 to the cup 191.

The sucking nozzle 201 is connected to a tank 204 via the piping 203. A sucking pump 205 is provided in the middle of the piping 203. When the control device 140 operates the sucking pump 205, the sucking nozzle 201 sucks the functional liquid accumulated in the cup 191, and the functional liquid is recovered to the tank 204.

The lifting mechanism 202 includes, for example, an air pressure cylinder. The lifting mechanism 202 may be configured by a servo motor and a motion converting mechanism which converts the rotational motion of the servo motor into a linear motion of the sucking nozzle 201. As for the motion converting mechanism, for example, a ball screw is used.

When the X-direction moving unit 172 moves the mass measuring unit 190 between the position indicated by the solid line in FIG. 8 and another position (e.g., the position indicated by the broken line in FIG. 8 or the position indicated by the two-dot chain line in FIG. 8), the lifting mechanism 202 retracts the sucking nozzle 201 from the inside of the cup 191 upward.

The liquid drain unit 200 is provided on, for example, a beam 210 extending in the Y direction above one end in the X direction of the base 171. By having the beam 210 provided with the liquid drain unit 200 located separately from a Y-axis beam 177, it is possible to suppress transmission of the vibration of the liquid drain unit 200 to the droplet discharging unit 160, thereby improving the drawing accuracy.

The liquid drain unit 200 may further have a slide mechanism 206 that slides the sucking nozzle 201 in the Y direction with respect to the base 171. When the liquid drain unit 200 is provided in the beam 210, the slide mechanism 206 slides the sucking nozzle 201 along the beam 210.

The slide mechanism 206 may have, for example, a servo motor and a motion converting mechanism which converts the rotational motion of the servo motor into a linear motion of the sucking nozzle 201. As for the motion converting mechanism, for example, a rack-and-pinion mechanism, a timing belt, and a pulley are used.

The slide mechanism 206 slides the sucking nozzle 201 in the Y direction so that the sucking nozzle 201 may suck the functional liquid sequentially from a plurality of cups 191 arranged in the Y direction. Therefore, the number of the sucking nozzles 201 may be reduced compared with a case where the sucking nozzle 201 is not slid in the Y direction.

Each cup 191 mixes and accumulates a plurality of types of functional liquids, and the sucking nozzle 201 sucks the mixed and accumulated plurality of types of functional liquids. The number of the sucking nozzles 201 may be reduced compared with a case where each cup 191 divides the plurality of types of functional liquids into different types of functional liquids and the sucking nozzle 201 is provided for each type of the functional liquids.

The draining process by the liquid drain unit 200 is performed during the maintenance process by, for example, the maintenance unit 180. Since the coating device 123a does not draw the functional liquid on the substrate 10 during the maintenance process, it is possible to prevent the lowering of the operation rate of the coating device 123a compared with a case where the draining process is performed during the drawing process or immediately before the drawing process. Hereinafter, the draining process of the coating device 123a will be described. The following operation of the coating device 123a is performed under control by the control device 140.

Figure 11:
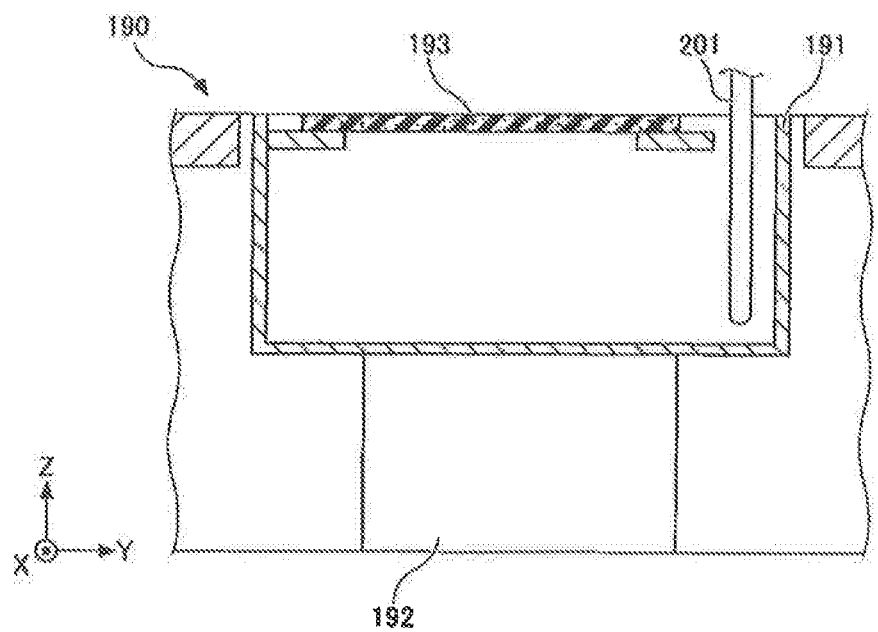
FIG. 11 is a cross-sectional view of the cup taken along line XI-XI of FIG. 10.

First, the X-direction moving unit 172 moves a plurality of mass measuring units 190 arranged in the Y direction directly below the beam 210. Subsequently, the slide mechanism 206 moves the sucking nozzle 201 directly above the cup 191 of a first mass measuring unit 190, and the lifting mechanism 202 inserts the sucking nozzle 201 into a first cup 191. As illustrated in FIG. 11, the sucking nozzle 201 is inserted into the cup 191 such that the sucking nozzle 201 does not come into contact with the cup 191 or a porous body 193. Subsequently, when the control device 140 operates the sucking pump 205, the sucking nozzle 201 sucks the functional liquid accumulated in the first cup 191, and the functional liquid is recovered to the tank 204.

Thereafter, the lifting mechanism 202 pulls the sucking nozzle 201 upward from the inside of the first cup 191. Subsequently, the slide mechanism 206 moves the sucking nozzle 201 directly above the cup 191 of a second mass measuring unit 190, and the lifting mechanism 202 inserts the sucking nozzle 201 into a second cup 191. Hereinafter, the functional liquid is discharged from the second cup 191 in the same manner. The same is applied to the discharge of the functional liquid from the third and subsequent cups 191.

The control device 140 may set the timing of the draining process based on the measurement result of the mass measuring device 192. The timing of the draining process is set so that the height of the liquid surface of the functional liquid inside the cup 19 may be kept below a predetermined value and the lowering of the operating rate may be prevented. The height of the liquid surface of the functional liquid in the cup 191 may be calculated from, for example, the mass of the functional liquid, the density of the functional liquid, and the bottom area of the cup 191.

The lower end of the sucking nozzle 201 may be inserted into a standby bus after the draining process and before the draining process. The standby bus is provided, for example, below one end of the Y direction of the beam 210. The standby bus maintains the inside of the sucking nozzle 201 in a vapor atmosphere of the solvent in order to suppress the drying of the functional liquid remaining in the sucking nozzle 201.

<Summary>

As described above, according to the present exemplary embodiment, the coating device 123a includes a cup 191 that receives the droplets discharged by the droplet discharging unit 160, a mass measuring device 192 that measures the mass of the functional liquid accumulated in the cup 191, and a liquid drain unit 200 that drains the functional liquid accumulated in the cup 191 from the cup 191. Therefore, the following effects (1) to (4) may be obtained.

(1) Since the liquid drain unit 200 performs the draining process, the manual operation of replacing the cup 191, which is required in the related art, becomes unnecessary. Therefore, it is possible to prevent the mass measuring device 192 from being damaged because the load is not erroneously applied to the mass measuring device 192 when the cup 191 is replaced.

(2) Since the cup 191 may be firmly coupled to the mass measuring device 192 with a screw or the like, vibration due to insufficient coupling between the cup 191 and the mass measuring device 192 may be suppressed and the mass may be accurately measured. In addition, in the related art, since the cup 191 was removably attached to the mass measuring device 192, such as a plate spring instead of a screw, vibration was easily generated due to the downflow formed in the coating device 123a.

(3) Since the space for replacing the cup 191 becomes unnecessary, the capacity of the cup 191 may be increased and the frequency of the draining process may be reduced. Thus, it is possible to shorten the time for stopping the drawing process for the draining process and improve the operation rate of the coating device 123a.

(4) It is not necessary to check the position of the cup 191 to avoid collision between the discharge head 161 and the cup 191 each time the cup 191 is replaced. This eliminates the need for a position sensor or the like to check the position of the cup 191. In addition, collision between the discharge head 161 and the cup 191 due to the failure of the position sensor may be avoided.

According to the present exemplary embodiment, the liquid drain unit 200 includes a sucking nozzle 201 which is inserted into the inside of the cup 191 to suck the functional liquid accumulated in the cup 191 and a lifting mechanism 202 which lifts and lowers the sucking nozzle 201. Therefore, a piping 203 for drainage may be connected to the sucking nozzle 201 instead of the cup 191 and the piping 203 may be designed without considering the movement of the cup 191. It is also possible to connect the piping 203 to the cup 191.

According to the present exemplary embodiment, the moving unit 170 has an X-direction moving unit 172 that moves the substrate holding unit 150 and the mass measuring unit 190 in the X direction with respect to the base 171. Since the X-direction moving unit 172 performs both the X-direction movement of the substrate holding unit 150 and the X-direction movement of the mass measuring unit 190, components such as the X-axis guide 173 may be made to be common in use and the manufacturing cost of the coating device 123a may be reduced.

According to the present exemplary embodiment, the coating device 123a further includes a beam 210 that extends in the Y direction above one end in the X direction of the base 171, and the liquid drain unit 200 is provided on the beam 210. By having the beam 210 provided with the liquid drain unit 200 located separately from a Y-axis beam 177, it is possible to suppress transmission of the vibration of the liquid drain unit 200 to the droplet discharging unit 160, thereby improving the drawing accuracy.

According to the present exemplary embodiment, the liquid drain unit 200 further has a slide mechanism 206 that slides the sucking nozzle 201 in the Y direction with respect to the base 171. When the liquid drain unit 200 is provided in the beam 210, the slide mechanism 206 slides the sucking nozzle 201 along the beam 210. The sucking nozzle 201 may suck the functional liquid sequentially from a plurality of cups 191 arranged in the Y direction. Therefore, the number of the sucking nozzles 201 may be reduced compared with a case where the sucking nozzle 201 is not slid in the Y direction.

According to the present exemplary embodiment, the droplet discharging unit 160 discharges a plurality of types of functional liquids, the cup 191 mixes and accumulates the plurality of types of functional liquids, and the sucking nozzle 201 sucks the mixed and accumulated plurality of types of functional liquids. The number of the sucking nozzles 201 may be reduced compared with a case where each cup 191 divides the plurality of types of functional liquids into different types of functional liquids and the sucking nozzle 201 is provided for each type of the functional liquids.

<Modification and Improvement>

While the present disclosure has been described in connection with the exemplary embodiments of the coating device and the like, the present disclosure is not limited to the above exemplary embodiments, and various modifications and improvements may be made within the scope of the present disclosure described in the claims.

Figure 12:
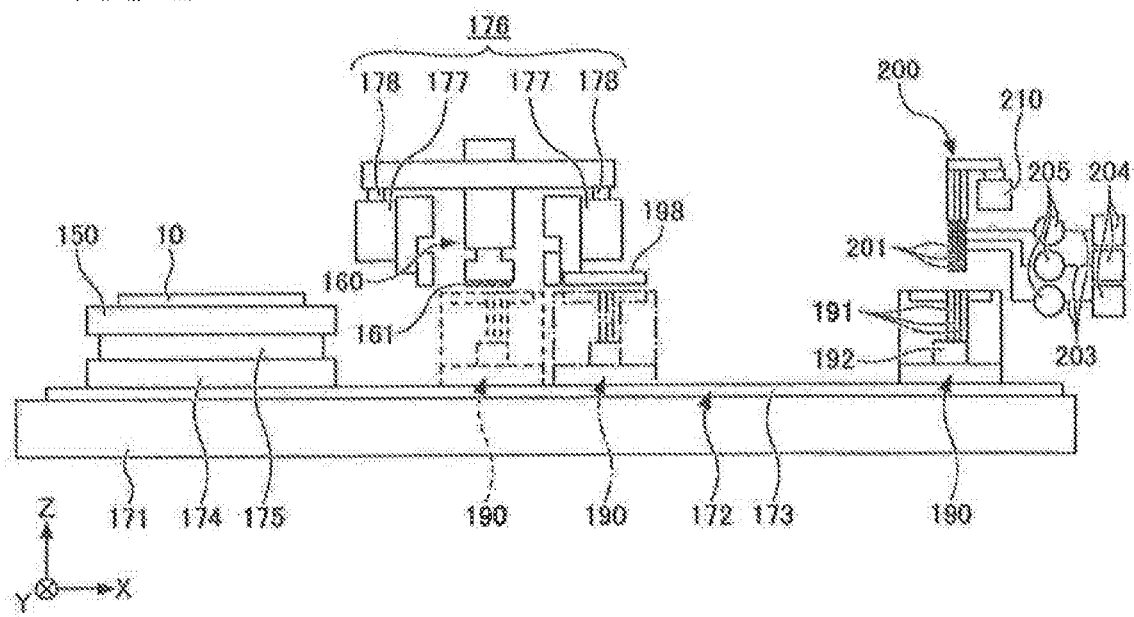
FIG. 12 is a side view illustrating the coating device according to a first modification.

According to the above exemplary embodiments, the droplet discharging unit 160 discharges droplets of a plurality of types of functional liquids, the cup 191 mixes and accumulates the plurality of types of functional liquids, and the sucking nozzle 201 sucks the mixed and accumulated plurality of types of functional liquids. However, the present disclosure is not limited thereto. As illustrated in FIG. 12, a plurality of cups 191 may be provided so that a plurality of types of functional liquids are divided according to the types of functional liquids, and a plurality of sucking nozzles 201 may be provided to suck a predetermined type of functional liquid. For example, a cup 191 which collects the material liquid of the red light emitting layer, a cup 191 which collects the material liquid of the green light emitting layer, and a cup 191 which collects the material liquid of the blue light emitting layer are separately provided. Thus, a sucking nozzle 201 which sucks the material liquid of the red light emitting layer, a sucking nozzle 201 which sucks the material liquid of the green light emitting layer, and a sucking nozzle 201 which sucks the material liquid of the blue light emitting layer are separately provided. This is effective when gelation or solidification occurs due to mixing of multiple functional liquids.

Figure 13:
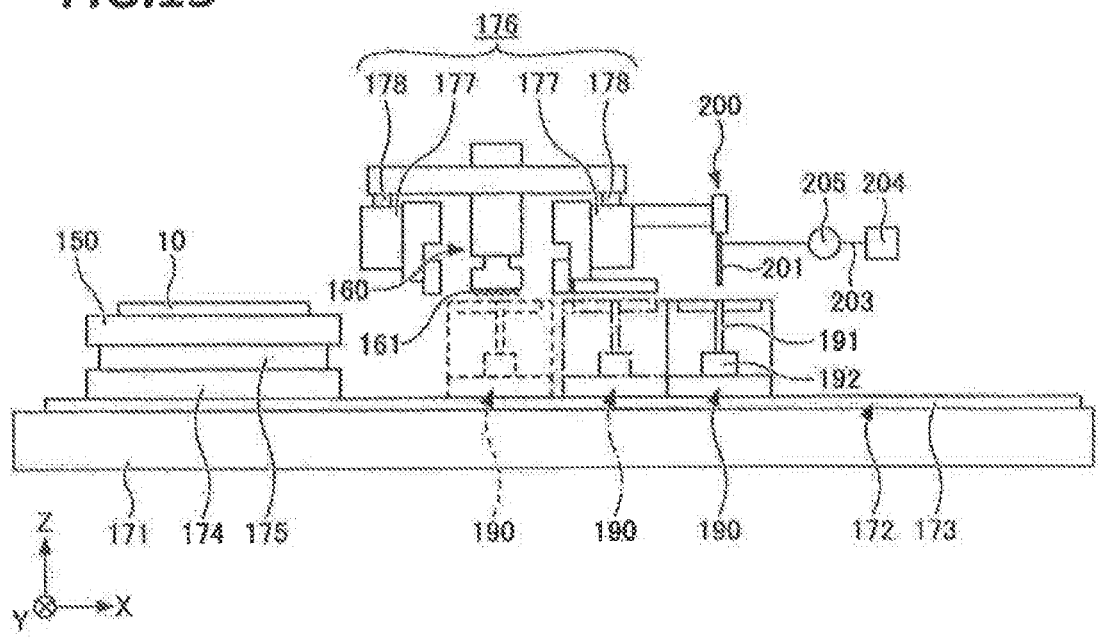
FIG. 13 is a side view illustrating the coating device according to a second modification.

The liquid drain unit 200 of the above exemplary embodiments is provided in the beam 210 as illustrated in FIG. 8, but may be provided in the Y-axis beam 177 as illustrated in FIG. 13. When the liquid drain unit 200 is provided in the Y-axis beam 177, a dedicated beam 210 is unnecessary. When the liquid drain unit 200 is provided in the Y-axis beam 177, the slide mechanism 206 slides the sucking nozzle 201 along the Y-axis beam 177.

In the above exemplary embodiments, the case where the present disclosure is applied to the coating device 123a of the light emitting layer formation block 123 has been described, but the present disclosure is not limited to this. The coating device of the present disclosure may draw the pattern of the functional liquid on the substrate. For example, the present disclosure is also applicable to the coating device 121a of the hole injecting layer formation block 121 and the coating device 122a of the hole transporting layer formation block 122. Further, the coating device 122a of the hole transporting layer formation block 122 may form a plurality of types of hole transporting layers 25 corresponding to a plurality of types of light emitting layers 26. The compatibility between light emitting layer 26 and the hole transporting layer 25 may be improved. Similarly, the coating device 121a of the hole injecting layer formation block 121 may form a plurality of types of hole injecting layers 24 corresponding to a plurality of types of light emitting layers 26. The compatibility between the light emitting layer 26 and the hole injecting layer 24 may be improved.

In the above exemplary embodiments, the types of the light emitting layers 26 includes three types of the red light emitting layer, the green light emitting layer, and the blue light emitting layer, but the present disclosure is not limited to this. For example, in addition to these three light emitting layers, a yellow light emitting layer including a yellow light emitting material that emits yellow light, which is an intermediate color between red and green and/or a light emitting layer including a cyan light emitting material that emits cyan light, which is an intermediate color between green and blue, may be used. As the number of combinations of emitted colors becomes larger, the range of color coordinates that may be displayed becomes broader.

For example, the organic EL display in the above exemplary embodiments is of a bottom emission type in which the light from the light emitting layer 26 is taken out from the substrate 10, but may be of a top emission type in which the light from the light emitting layer 26 is taken out from the side opposite to the substrate 10.

In the case of the top emission type, the substrate 10 may not be a transparent substrate, but may be an opaque substrate. The light from the light emitting layer 26 is taken out from the side opposite to the substrate 10.

In the case of the top emission type, the anode 21, which is a transparent electrode, is used as a counter electrode, and the cathode 22 is used as a pixel electrode provided for each unit circuit 11. In this case, since the arrangement of the anode 21 and the cathode 22 is reversed, the electron injecting layer 28, the electron transporting layer 27, the light emitting layer 26, the hole transporting layer 25, and the hole injecting layer 24 are formed in this order on the cathode 22.

In the above exemplary embodiments, the organic layer 23 has the hole injecting layer 24, the hole transporting layer 25, the light emitting layer 26, the electron transporting layer 27, and the electron injecting layer 28 in this order from the anode side 21 toward the cathode 22 side, but the organic layer 23 may have at least the light emitting layer 26. The organic layer 23 is not limited to the configuration illustrated in FIG. 2.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A coating device for drawing a pattern of a functional liquid on a substrate, the coating device comprising:
   a substrate holder configured to hold the substrate;
   a nozzle configured to discharge a droplet of the functional liquid;
   a first mover configured to move the substrate holder in a main scanning direction on a base, said base extending in a length direction in the main scanning direction;
   a second mover configured to move the nozzle in a sub scanning direction with respect to the base, wherein said main scanning direction is orthogonal to the sub scanning direction;

a plurality of mass measurers, each mass measurer including a cup configured to receive the droplet discharged by the nozzle and a scale configured to measure a mass of the functional liquid accumulated in the cup;
a sucking nozzle configured to be inserted into an inside of the cup and the functional liquid accumulated in the cup; and
a first beam extending in the sub scanning direction and positioned above one end of the base in the main scanning direction,
wherein the first beam includes a slide that slides the sucking nozzle in the sub scanning direction with respect to the base, and
wherein the plurality of the mass measurers are arranged in the sub-scanning direction directly below the first beam.

2. The coating device of claim 1, further comprising:
a lift configured to lift and lower the sucking nozzle.

3. The coating device of claim 2, wherein the first mover includes a main scanning direction motor configured to move the substrate holder and the plurality of mass measurers in the main scanning direction with respect to the base.

4. The coating device of claim 3, wherein the second mover includes a sub scanning direction motor configured to move the nozzle in the sub scanning direction with respect to the base and a second beam extending in the sub scanning direction above the base, and
wherein the nozzle is configured to move along the second beam.

5. The coating device of claim 2, wherein the nozzle is configured to discharge a droplet from a plurality of types of functional liquids,
wherein each cup is configured to mix and accumulate the plurality of types of functional liquids, and
the sucking nozzle is configured to suck the mixed plurality of types of functional liquids.

6. The coating device of claim 2, wherein the nozzle is configured to discharge a droplet from a plurality of types of functional liquids,
wherein each cup is configured to receive one of the plurality of types of functional liquids, and
a plurality of sucking nozzles is provided to each suck a predetermined type of functional liquid from among the plurality of types of functional liquids.

* * * * *